United States Patent
Shi et al.

(10) Patent No.: US 12,426,405 B2
(45) Date of Patent: Sep. 23, 2025

(54) LIGHT-EMITTING DEVICE AND LIGHTING APPARATUS

(71) Applicant: QUANZHOU SANAN SEMICONDUCTOR TECHNOLOGY CO., LTD., Nanan (CN)

(72) Inventors: Baojun Shi, Nanan (CN); Jin Xu, Xiamen (CN); Shiwei Liu, Xiamen (CN); Dazhong Chen, Xiamen (CN); Shuijie Wang, Xiamen (CN); Ke Liu, Xiamen (CN); Chung-Ying Chang, Xiamen (CN); Wen-Chia Huang, Xiamen (CN); Yu-Tsai Teng, Xiamen (CN)

(73) Assignee: QUANZHOU SANAN SEMICONDUCTOR TECHNOLOGY CO., LTD., Nanan (CN)

( * ) Notice: Subject to any disclaimer, the term of this patent is extended or adjusted under 35 U.S.C. 154(b) by 490 days.

(21) Appl. No.: 17/885,952

(22) Filed: Aug. 11, 2022

(65) Prior Publication Data

US 2023/0052304 A1 Feb. 16, 2023

(30) Foreign Application Priority Data

Aug. 16, 2021 (CN) .................. 202110938282.X

(51) Int. Cl.
*H01L 33/38* (2010.01)
*H01L 33/20* (2010.01)
(Continued)

(52) U.S. Cl.
CPC ...... *H10H 20/01* (2025.01); *H10H 20/01335* (2025.01); *H10H 20/813* (2025.01);
(Continued)

(58) Field of Classification Search
CPC ......... H01L 33/46; H01L 33/38; H01L 33/08; H01L 33/20
See application file for complete search history.

(56) References Cited

U.S. PATENT DOCUMENTS 8,859,401 B2 * 10/2014 Ohmae ............. H01L 21/02507
438/34
2012/0074441 A1 * 3/2012 Seo .................. H01L 33/42
257/E33.068

(Continued)

*Primary Examiner* — Dale E Page
*Assistant Examiner* — Wilner Jean Baptiste
(74) *Attorney, Agent, or Firm* — MUNCY, GEISSLER, OLDS & LOWE, P.C.

(57) ABSTRACT

A light-emitting device includes a substrate and an epitaxial unit. The substrate has a first and a second surface. The substrate is formed on the first surface with a plurality of protrusions. The epitaxial unit includes a first semiconductor layer, an active layer, and a second semiconductor layer that are sequentially disposed on the first surface of the substrate. The first surface of the substrate has a first area that is not covered by the epitaxial unit, and a second area this is covered by the epitaxial unit. A height difference (h2) between the first area and the second area is no greater than 1 μm. A display apparatus and a lighting apparatus are also disclosed.

20 Claims, 13 Drawing Sheets

(51) Int. Cl.
*H10H 20/01* (2025.01)
*H10H 20/813* (2025.01)
*H10H 20/819* (2025.01)
*H10H 20/831* (2025.01)
*H01L 23/00* (2006.01)
*H10H 20/80* (2025.01)
*H10H 20/84* (2025.01)

(52) U.S. Cl.
CPC ........ *H10H 20/819* (2025.01); *H10H 20/831* (2025.01); *H01L 24/05* (2013.01); *H01L 24/13* (2013.01); *H01L 24/16* (2013.01); *H01L 2224/05552* (2013.01); *H01L 2224/05572* (2013.01); *H01L 2224/05573* (2013.01); *H01L 2224/05624* (2013.01); *H01L 2224/05639* (2013.01); *H01L 2224/13124* (2013.01); *H01L 2224/13139* (2013.01); *H01L 2224/16225* (2013.01); *H10H 20/84* (2025.01); *H10H 20/882* (2025.01)

(56) References Cited

U.S. PATENT DOCUMENTS

2016/0172560 A1\* 6/2016 Chen .................. H01L 33/62
                                                                                     257/99
2022/0149243 A1\* 5/2022 Wang ................ H01L 33/382

\* cited by examiner

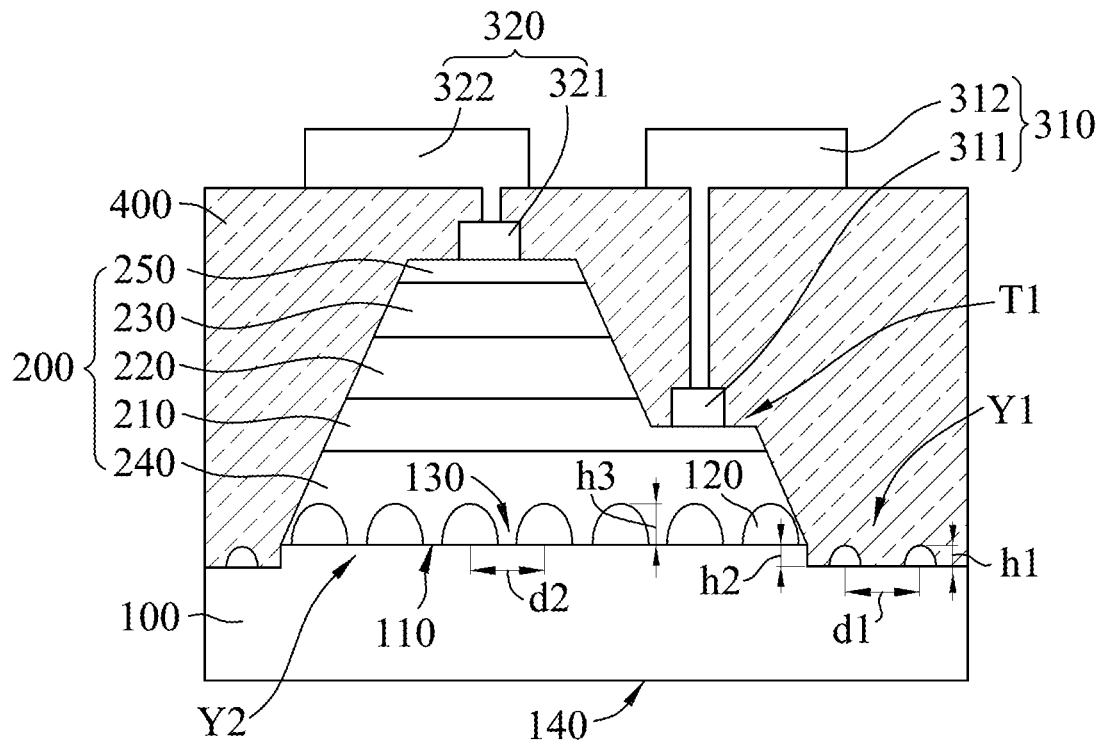
FIG.1A₁
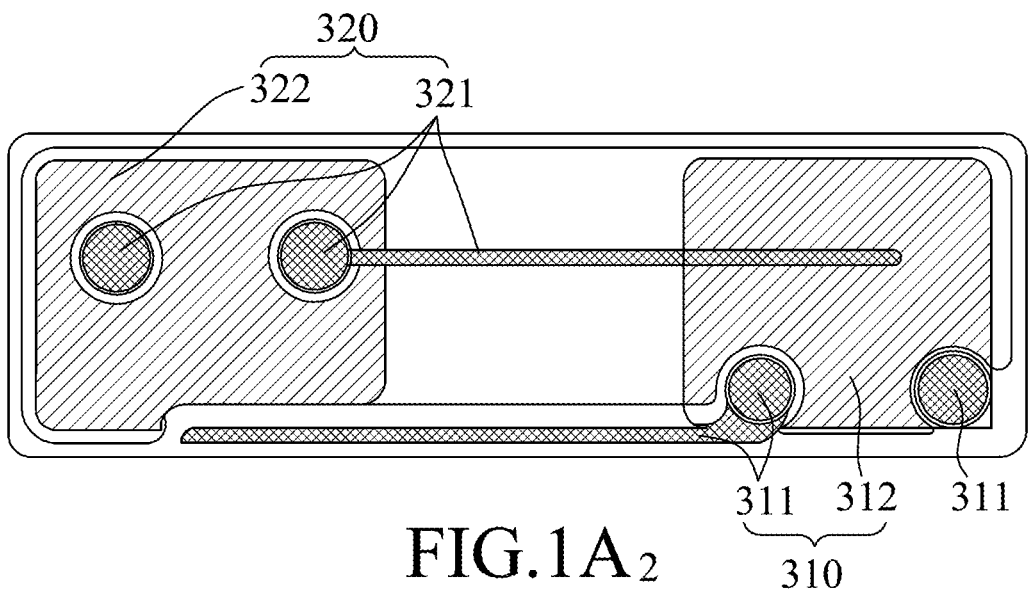
FIG.1A₂

LIGHT-EMITTING DEVICE AND LIGHTING APPARATUS

CROSS-REFERENCE TO RELATED APPLICATION

This application claims priority to Chinese Invention Patent Application No. 202110938282.X, filed on Aug. 16, 2021.

FIELD

The disclosure relates to a light-emitting device, a display apparatus and a lighting apparatus including the light-emitting device.

BACKGROUND

A light-emitting diode (LED) that includes a light-emitting material may produce light through re-combinations of electrons and holes. The LED may be used as a light source for a lighting apparatus, a display apparatus, etc.

Gallium nitride (GaN) is a third-generation semiconductor material and has wide direct bandgap and good chemical stability. GaN thus has broad applicability in many devices, such as optoelectronic devices and high-frequency microwave devices. In general, a GaN-based optoelectronic device is formed on a sapphire substrate. However, a lattice mismatch between sapphire and GaN is about 15%, which may result in a high defect density in an epitaxial layer of the optoelectronic device. For reducing the defect and improving light-extraction efficiency, a patterned sapphire substrate (PSS) is applied in preparing the optoelectronic device.

SUMMARY

Therefore, an object of the disclosure is to provide a light-emitting device, a display apparatus, and a lighting apparatus, that can alleviate or eliminate at least one of the drawbacks of the prior art.

According to a first aspect of the disclosure, a light-emitting device includes: a substrate and an epitaxial unit.

The substrate has a first surface and a second surface opposite to the first surface. The substrate is formed on the first surface with a plurality of protrusions that are spaced apart from one another.

The epitaxial unit includes a first semiconductor layer, an active layer, and a second semiconductor layer that are sequentially disposed on the first surface of the substrate in such order.

The first surface of the substrate has a first area and a second area. The first area is not covered by the epitaxial unit, and the second area is covered by the epitaxial unit. The first area is lower than the second area, and a height difference between the first area and the second area is no greater than 1 µm.

According to a second aspect of the disclosure, a lighting apparatus includes the aforesaid light-emitting device.

BRIEF DESCRIPTION OF THE DRAWINGS

Other features and advantages of the disclosure will become apparent in the following detailed description of the embodiments with reference to the accompanying drawings, of which:

FIG. $1A_1$ is a partly cross-sectional view illustrating an embodiment of a light-emitting device in accordance with the disclosure;

Figure 1B:
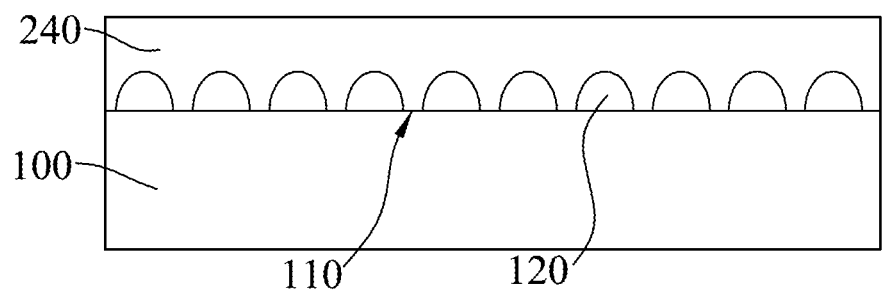
Figure 1C:
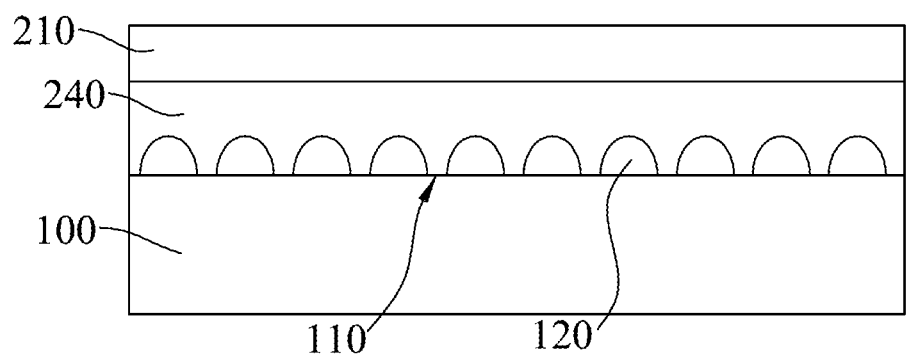
Figure 1D:
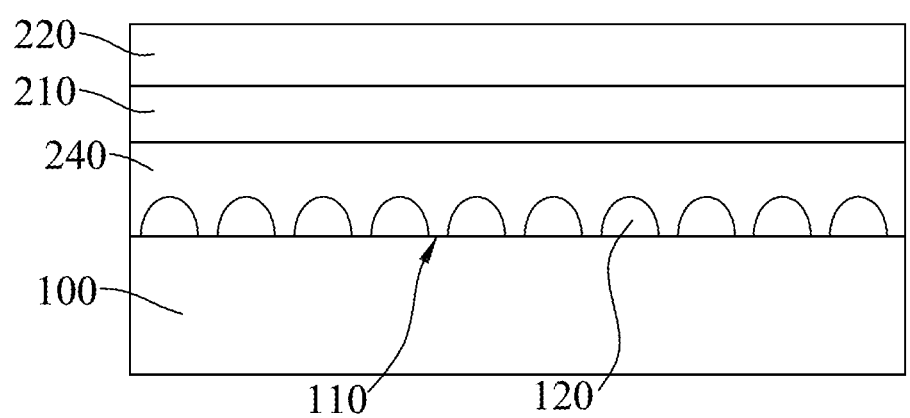
Figure 1E:
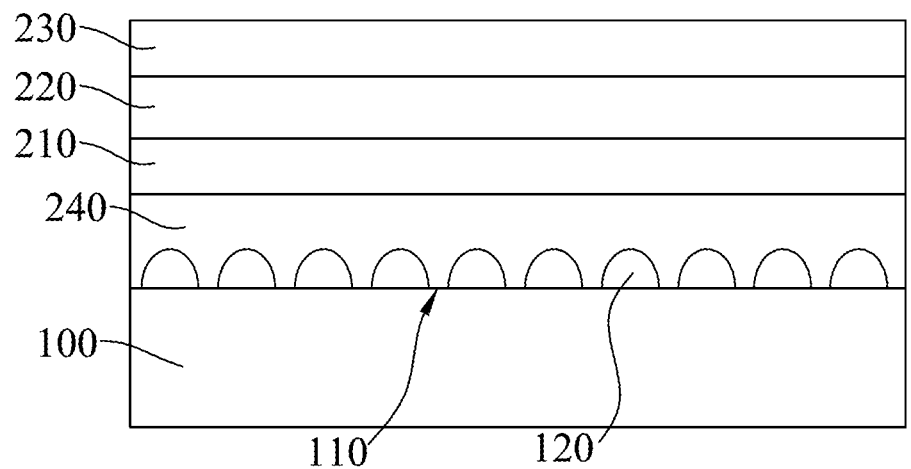
Figure 1F:
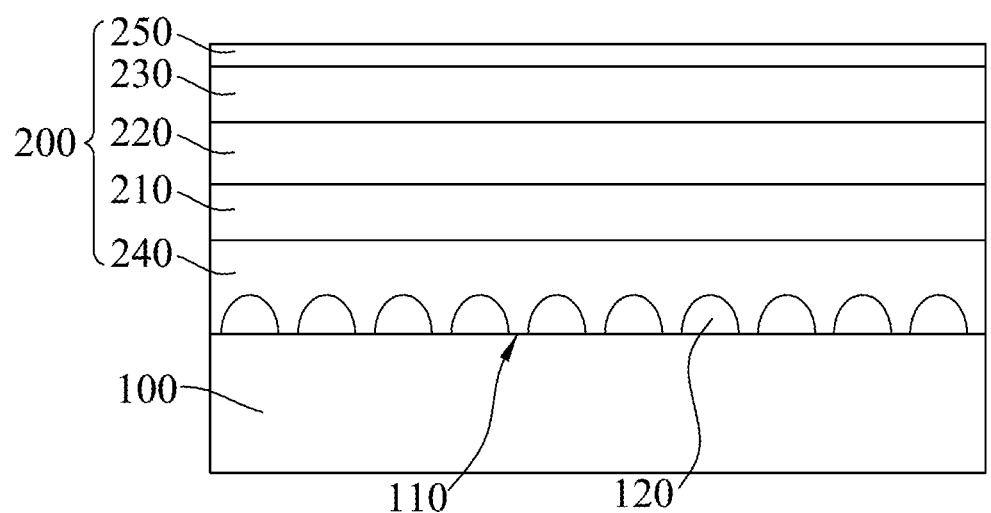
Figure 1G:
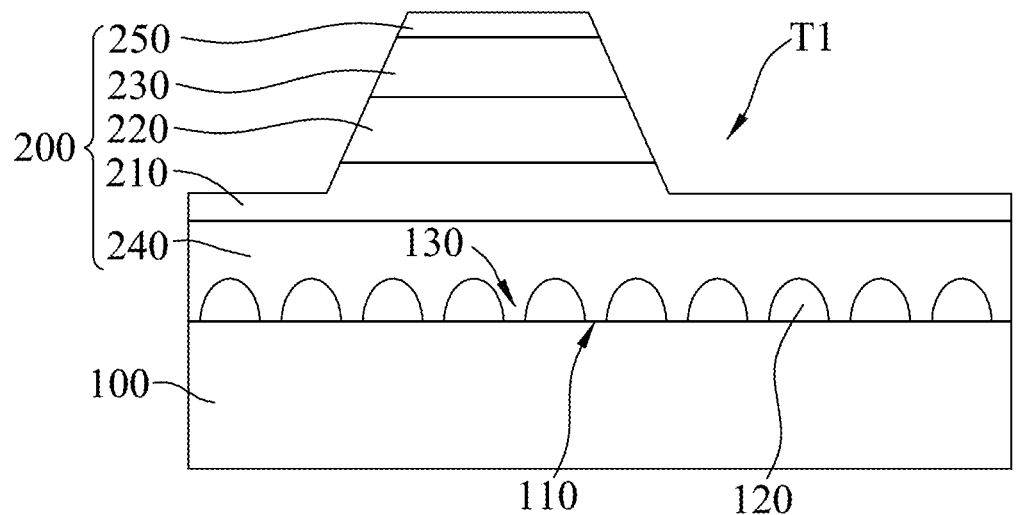
Figure 1H:
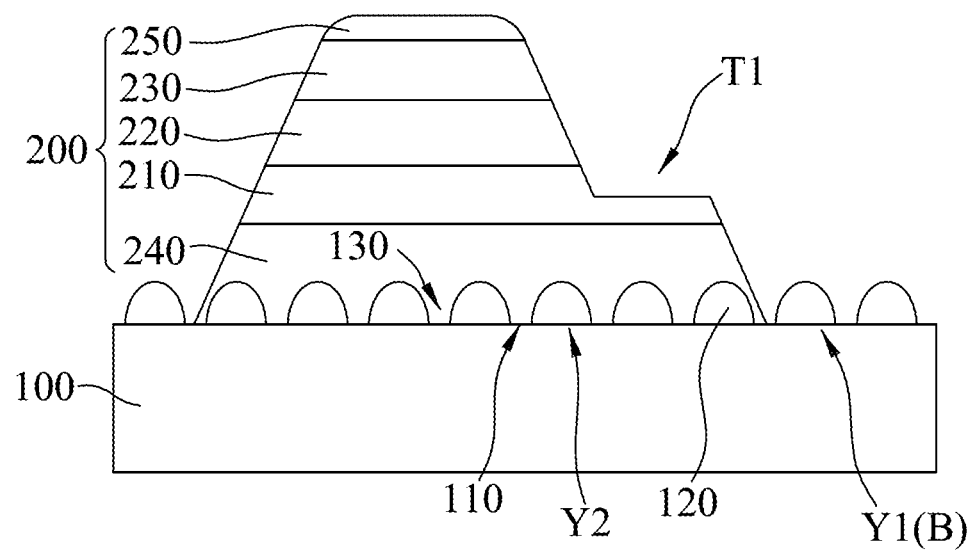
Figure 1I:
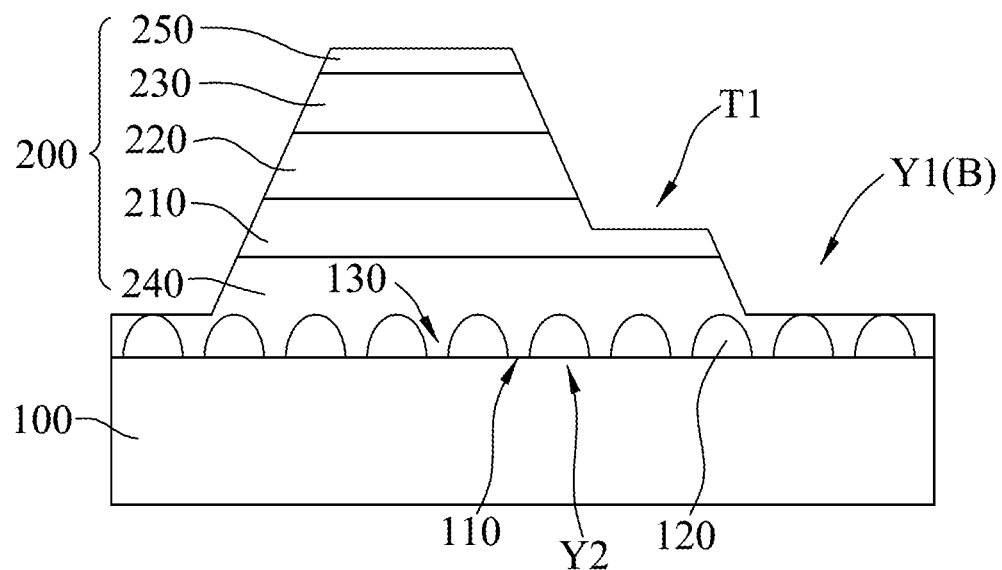
Figure 1J:
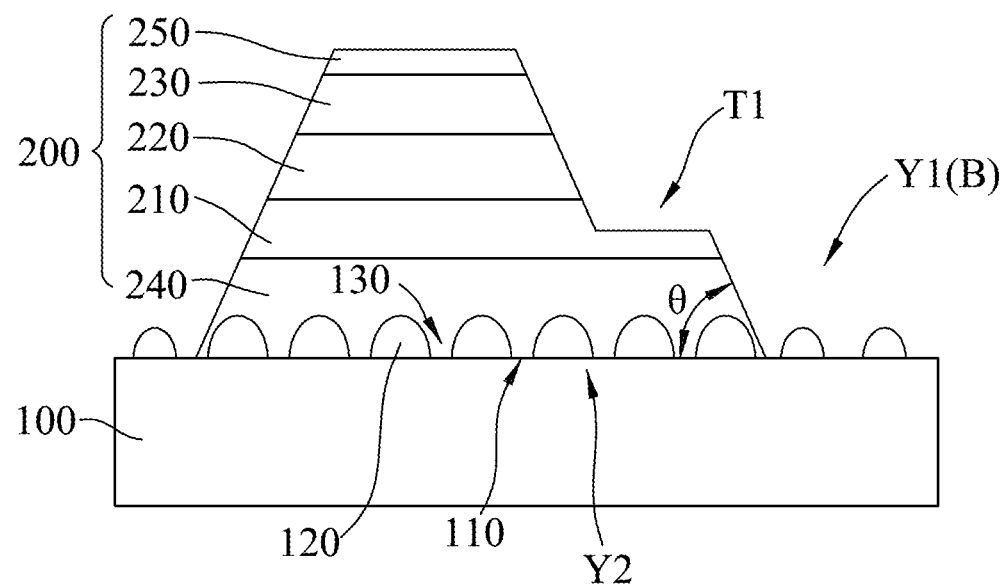
Figure 1K:
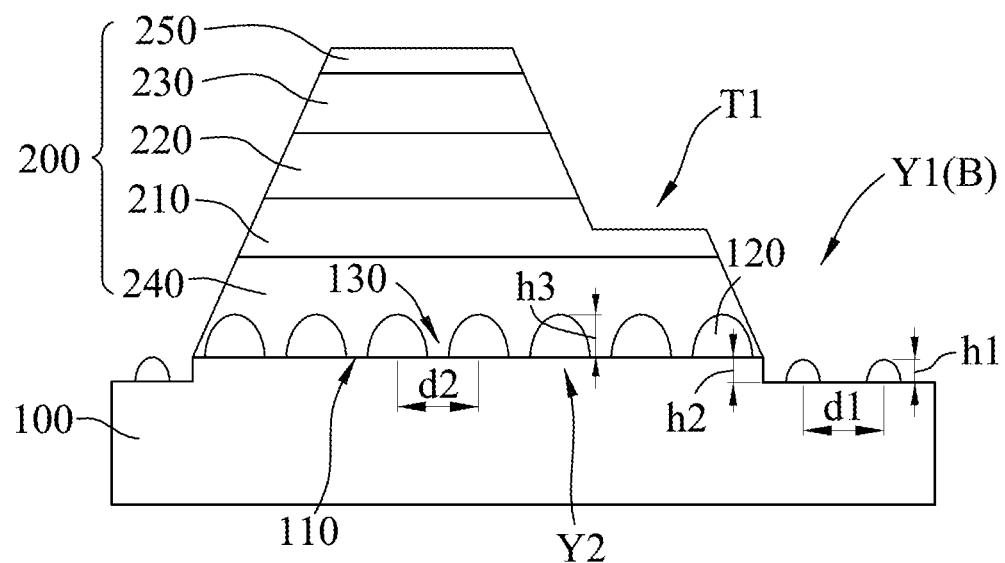
Figure 1L:
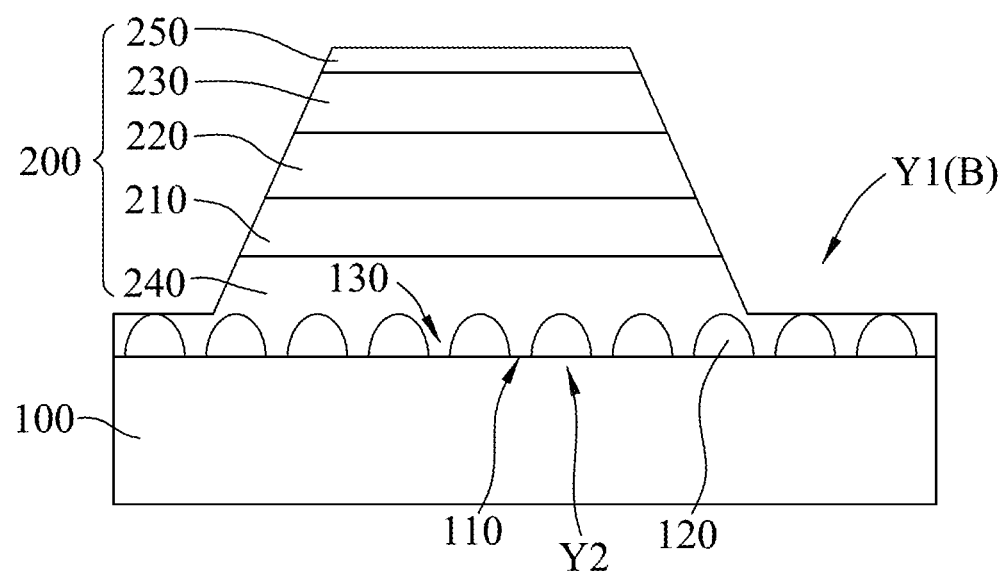
Figure 1M:
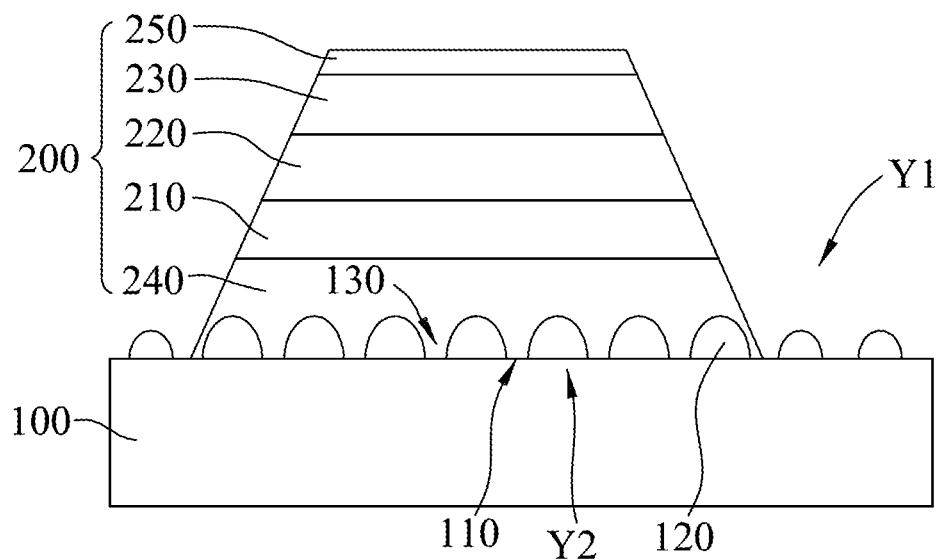
Figure 1N:
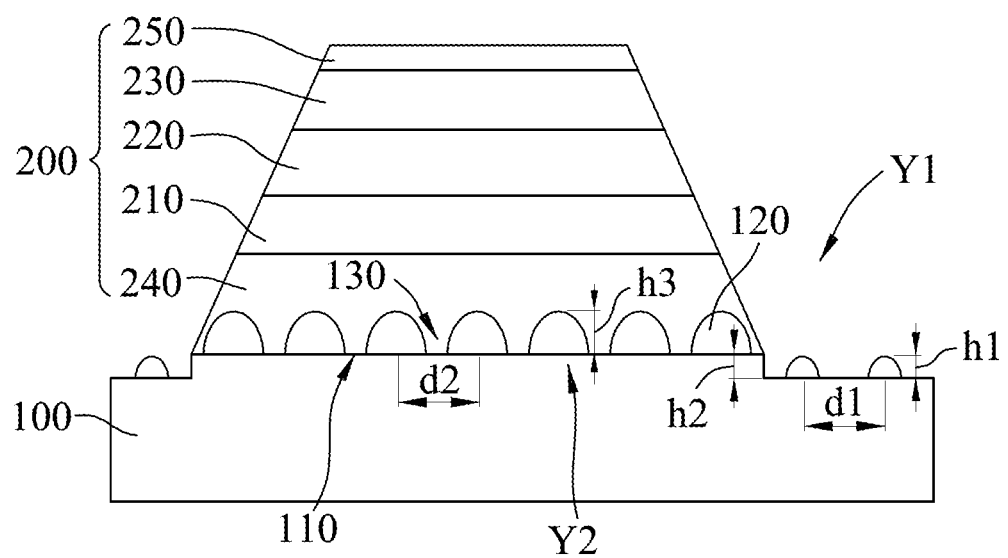
Figure 1O:
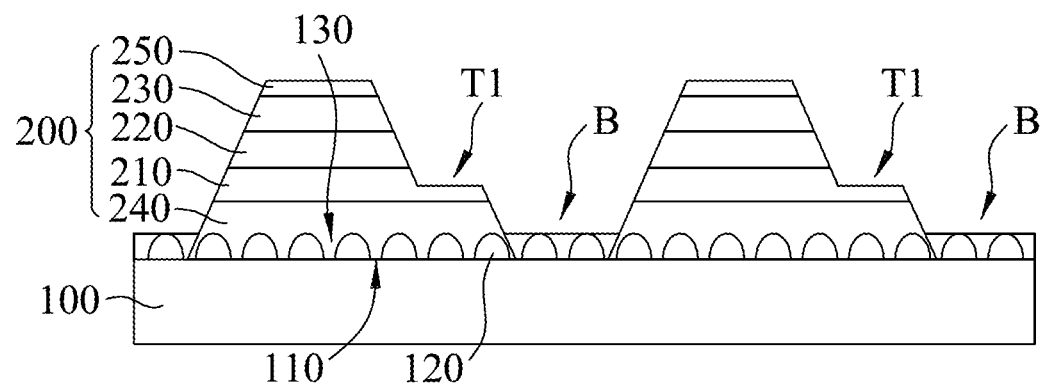
Figure 1P:
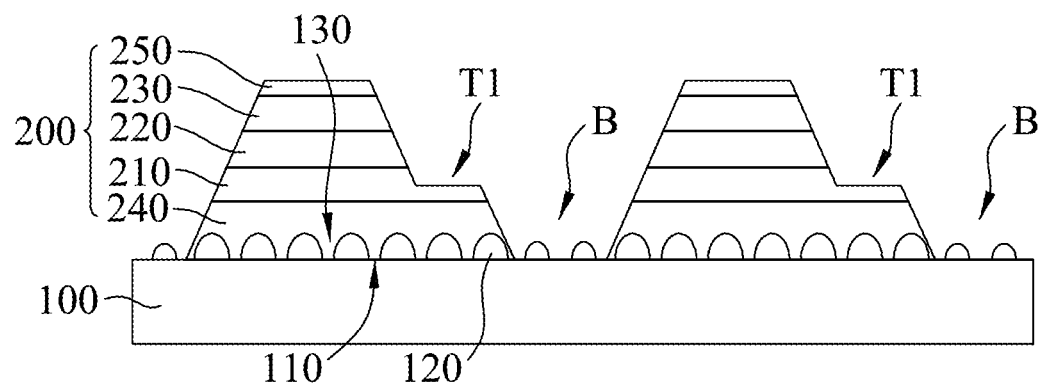
Figure 1Q:
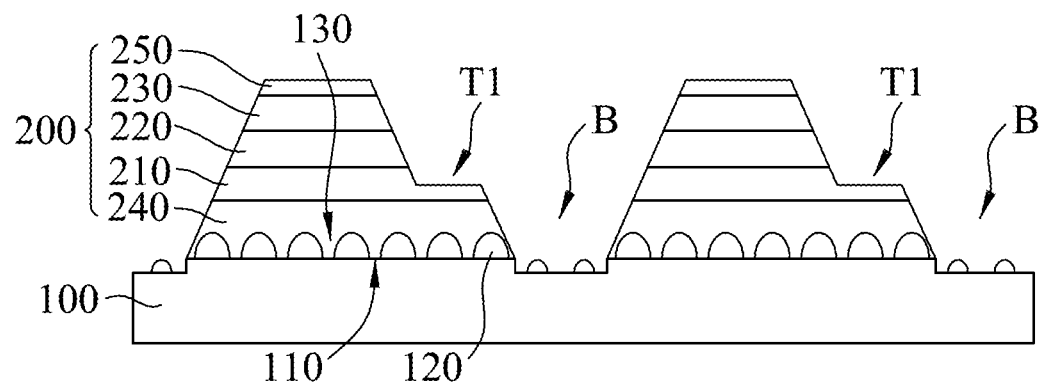
Figure 1R:
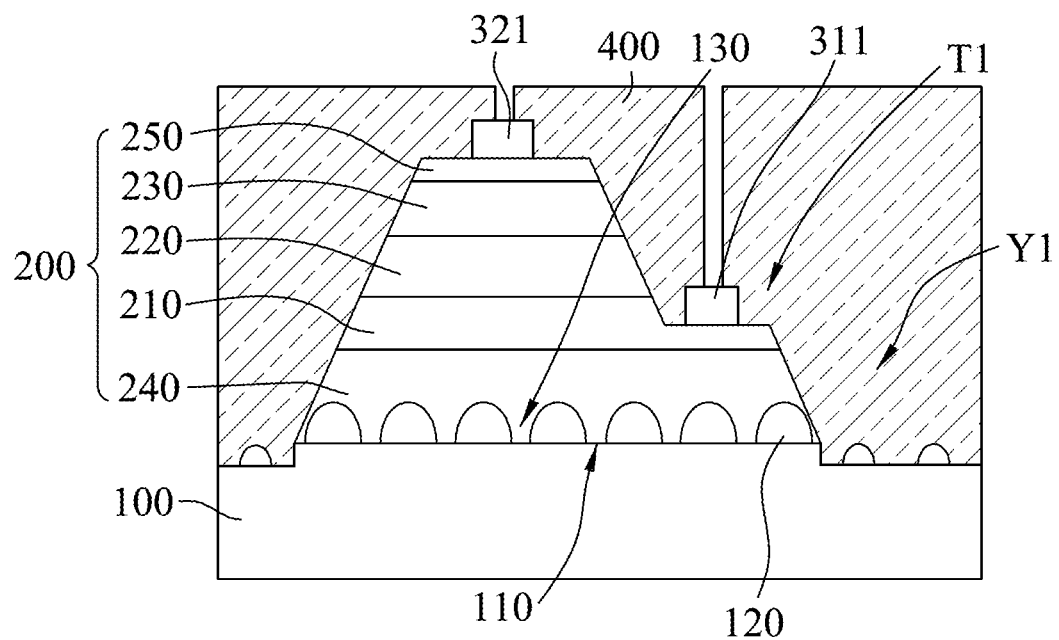
Figure 1S:
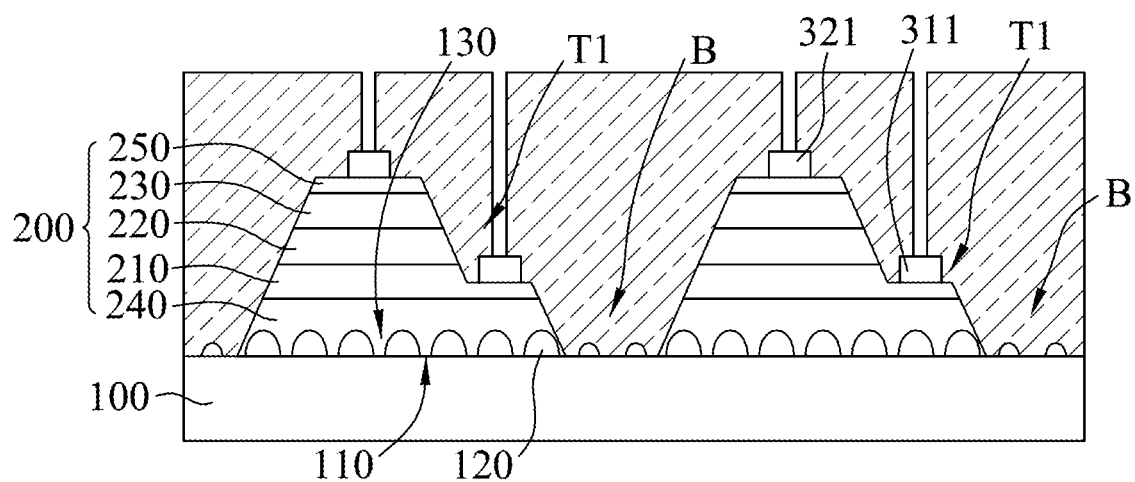
Figure 1T:
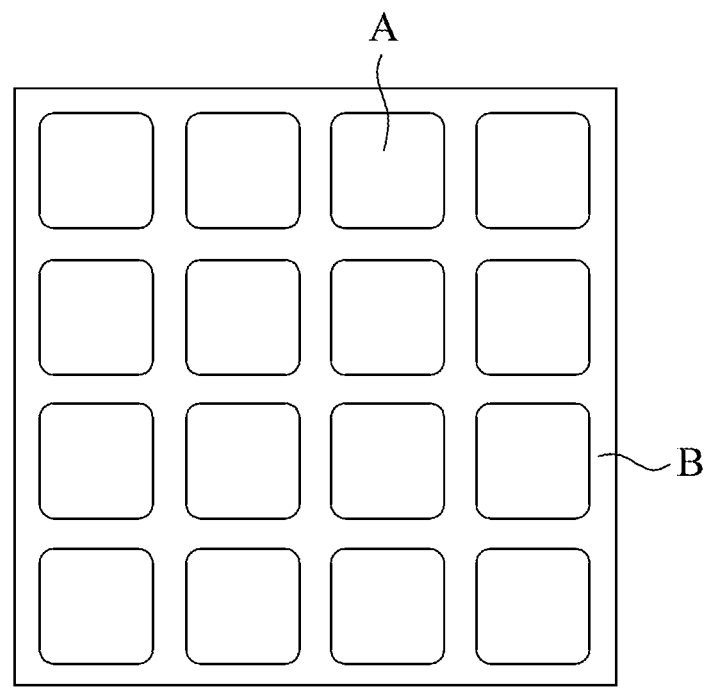
Figure 2:
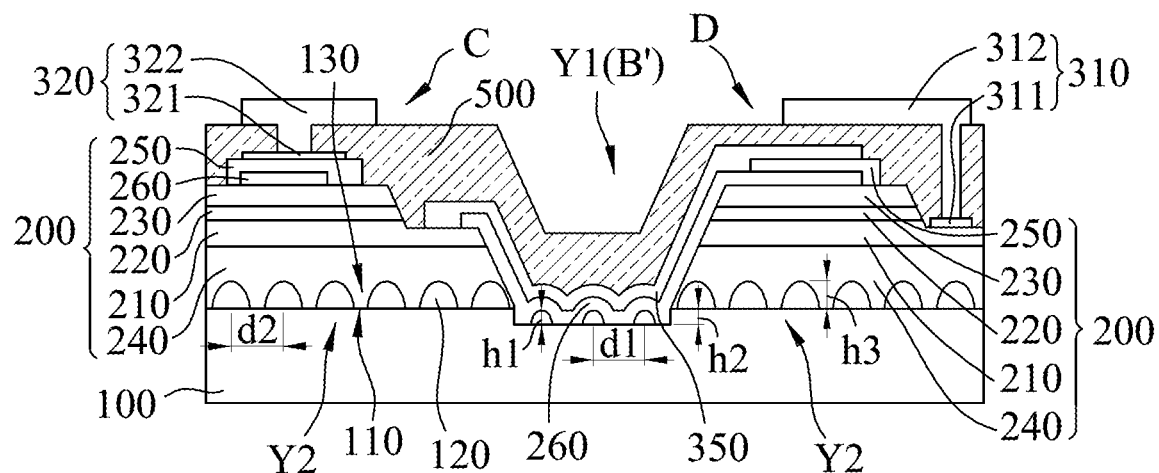
Figure 3:
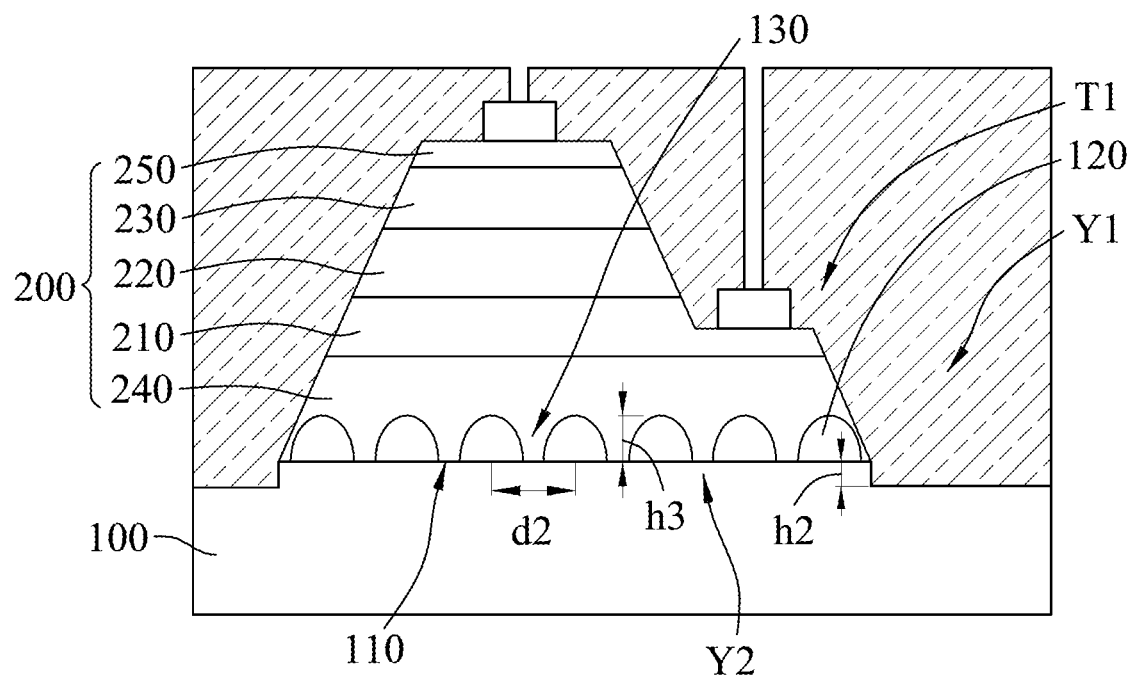
Figure 4:
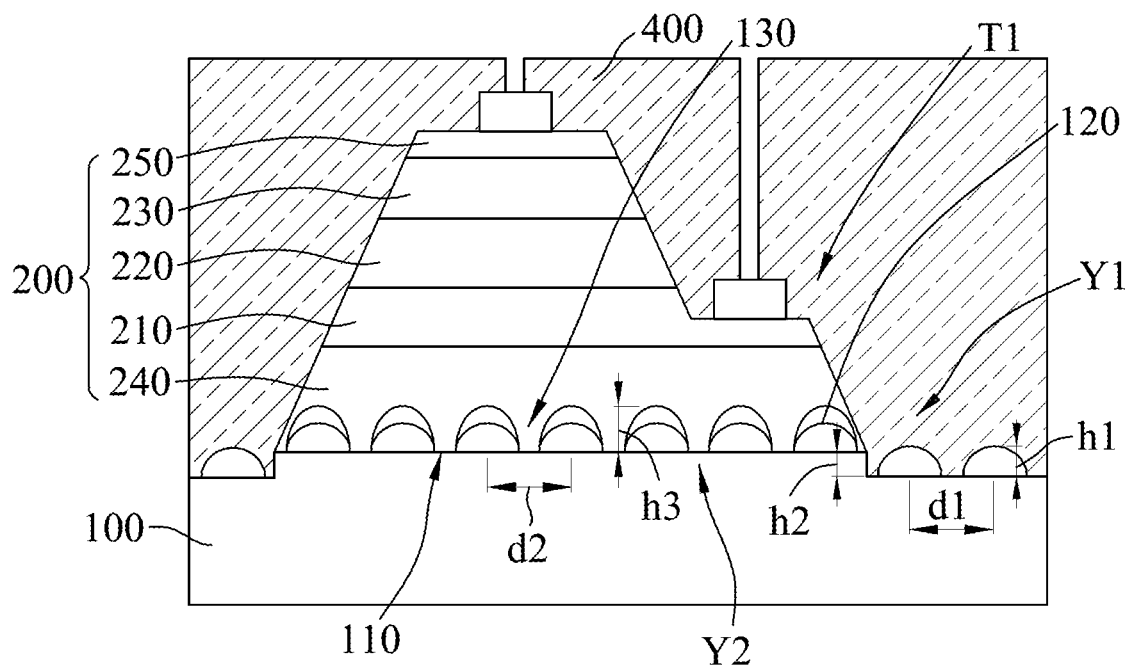
Figure 5:
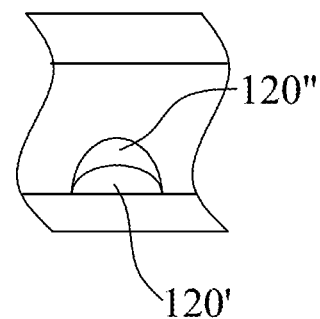
Figure 6:
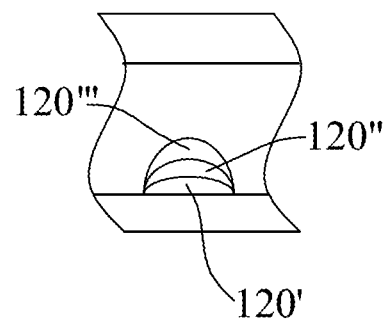
Figure 7:
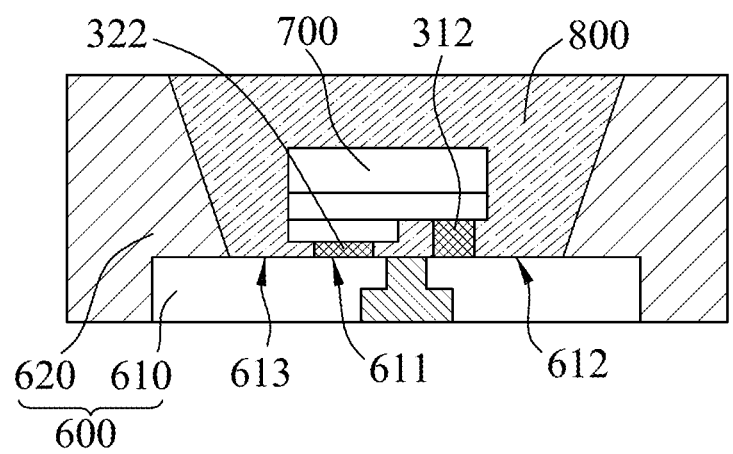

FIG. $1A_2$ is a top view illustrating the embodiment of the light-emitting device in accordance with the disclosure;

FIGS. 1B-1G are schematic views showing an epitaxial unit-forming step and an etching step in a process for making the embodiment of the light-emitting device;

FIG. 1H is a schematic view showing a variation of a structure shown in FIG. 1G;

FIGS. 1I-1K are schematic views showing an etching step using an inductively coupled plasma (ICP) in the process for making an embodiment of the light-emitting device in accordance with the disclosure;

FIGS. 1L-1N are schematic views showing an etching step using an inductively coupled plasma (ICP) in the process for making another embodiment of the light-emitting device in accordance with the disclosure;

FIGS. 1O-1Q are schematic views showing an etching step using an inductively coupled plasma (ICP) in the process for making a further embodiment of the light-emitting device in accordance with the disclosure;

FIG. 1R is a schematic view showing an insulating layer being formed on the structure shown in FIG. 1K;

FIG. 1S is a schematic view showing an insulating layer being formed on the structure shown in FIG. 1G;

FIG. 1T is a top view of an embodiment of the light-emitting device of the disclosure;

FIG. 2 is a partly cross-sectional view showing an embodiment of the light-emitting device of the disclosure;

FIG. 3 is a schematic view showing an embodiment of the light-emitting device of the disclosure;

FIG. 4 is a schematic view showing an embodiment of the light-emitting device of the disclosure, which includes a plurality of protrusions each having a first portion and a second portion;

FIG. 5 is a fragmentary schematic view showing the protrusions shown in FIG. 4;

FIG. 6 is a fragmentary schematic view showing a variation of the protrusions shown in FIG. 5; and FIG. 7 is a schematic cross-sectional view showing an embodiment of a lighting apparatus of the disclosure.

DETAILED DESCRIPTION

Before the disclosure is described in greater detail, it should be noted that where considered appropriate, reference numerals or terminal portions of reference numerals have been repeated among the figures to indicate corresponding or analogous elements, which may optionally have similar characteristics.

FIG. $1A_1$ shows an embodiment of a light-emitting device according to the present disclosure. The light-emitting device may be a flip-chip light-emitting device. The light-emitting device may have a size ranging from 90,000 µm² to 2,000,000 µm².

The light-emitting device may be a mini light-emitting device or a micro light-emitting device. For example, the light-emitting device may be a mini flip-chip light-emitting diode that has a size no greater than 90,000 µm², a width or a length ranging from 100 µm to 500 µm, and a thickness ranging from 40 µm to 100 µm.

The light-emitting device may be a micro flip-chip light-emitting diode that, for example, has a length ranging from 2 µm to 100 µm, a width ranging from 2 µm to 100 µm, and a thickness ranging from 2 µm to 100 µm.

Referring to FIG. 1A$_1$, the light-emitting device of the embodiment of this disclosure includes a substrate 100 and an epitaxial unit 200 disposed on the substrate 100. The epitaxial unit 200 may have a thickness ranging from 2 μm to 8 μm.

In the embodiment of the disclosure, the substrate 100 has a first surface 110 and a second surface 140 opposite to the first surface 110. The second surface 140 may be a light exiting surface. The epitaxial unit 200 is disposed on the first surface 110 of the substrate 100. The substrate 100 may be a patterned substrate that is formed on the first surface 110 with a plurality of protrusions 120. The protrusions 120 are spaced apart from one another by a plurality of recesses 130. The recesses 130 are parts of the first surface 110. The substrate 100 with a patterned structure may alleviate a lattice mismatch between the substrate 100 and the epitaxial unit 200. The first surface 110 of the substrate 100 has a first area (Y1) that is not covered by the epitaxial unit 200, and a second area (Y2) covered by the epitaxial unit 200. In some embodiments, the first area (Y1) has a width that is no greater than 25 μm.

The epitaxial unit 200 includes a first semiconductor layer 210, an active layer 220, and a second semiconductor layer 230 that are sequentially disposed on the first surface 110 of the substrate 100 in such order.

In some embodiments, the epitaxial unit 200 further includes a current-spreading layer 250 that is formed on a surface of the second semiconductor layer 230. At least 90% area portion of the surface of the second semiconductor layer 230 is covered by the current-spreading layer 250. The current-spreading layer 250 is formed an ohmic contact with the second semiconductor layer 230. The current-spreading layer 250 could uniformly spread currents from the second electrode 320 in the second semiconductor layer 230 to achieve lateral current spreading.

The light-emitting device further includes a first electrode 310 that is electrically connected to the first semiconductor layer 210, and that includes a first contact electrode portion 311 and a first pad electrode portion 312. The epitaxial unit 200 has a mesa area (T1) on which the first contact electrode portion 311 is disposed. The mesa area (T1) is a portion of a surface of the first semiconductor layer 210. The first contact electrode portion 311 and the first semiconductor layer 210 form an ohmic contact.

The light-emitting device further includes a second electrode 320 that is electrically connected with and disposed on the second semiconductor layer 230. The second electrode 320 includes a second contact electrode portion 321 and a second pad electrode portion 322.

The second contact electrode portion 321 and the second semiconductor layer 230 form an ohmic contact. In some embodiments in which the epitaxial unit 200 has the current-spreading layer 250, the second contact electrode portion 321 may be disposed on the current-spreading layer 250 and may form an ohmic contact with the current-spreading layer 250.

In some embodiments, the first electrode 310 may be an N-type electrode (e.g. including N-type pad electrode portion 312), and the second electrode 320 may be a P-type electrode (e.g. including P-type pad electrode portion 322).

In some embodiments, the first electrode 310 and the second electrode 320 are made of a conductive material (e.g., Ni, Au, Ag, Cr, Ti, Pt, Pd, Rh, Ir, Al, Sn, In, Ta, Cu, Co, Fe, Ru, Zr, W, Mo, etc.), and each may have a shape, e.g., round, rectangular, etc.

Considering that the light from the active layer 220 may be reflected by the first electrode 310 or the second electrode 320 before being emitted outwardly, the first electrode 310 and the second electrode 320 may be made of a material with high reflectivity (e.g. Al or Ag).

For improving current spreading, referring to FIG. 1A$_2$, the second electrode 320 may include two of the second contact electrode portions 321. One of second contact electrode portions 321 includes a main portion (i.e., circle-shape portion) and an extending portion (i.e., bar-shape portion) laterally extending from the main portion for a substantial distance. The current-spreading layer 250 and the extending portion of the second contact electrode portion 321 improve lateral current spreading in various lateral directions. Therefore, the current spreading on the surface of the second semiconductor layer 230, on which the current-spreading layer 250 is formed, is improved so as to improve luminance uniformity.

The light-emitting device further includes an insulating layer 400 that is formed to cover the epitaxial unit 200, the first area (Y1) of the substrate 100, a side wall and a part of an upper surface of the first contact electrode portion 311, and a side wall and a part of an upper surface of the second contact electrode portion 321. The first pad electrode portion 312 and the second pad electrode portion 322 are disposed on the insulating layer 400. The insulating layer 400 has two openings for the first pad electrode portion 312 and the second pad electrode portion 322 extending therethrough so as to respectively connect with the first contact electrode portion 311 and the second contact electrode portion 321. The insulating layer 400 may allow most of light from the active layer 220 to pass therethrough or may allow the light to be reflected.

The position and/or shape of the first electrode 310 and the second electrode 320 may substantially correspond to those of the two openings of the insulating layer 400.

In some embodiments, the substrate 100 may be made of sapphire. The protrusions 120 formed on the first surface 110 of the substrate 100 may be made by pattern imprinting, wet etching or dry etching. The protrusions 120 may be made of a material the same as that of the substrate 100, or a material different from that of the substrate 100. In some embodiments, the material for the substrate 100 may be Al$_2$O$_3$, and the material for the protrusions may be Al$_2$O$_3$, SiO$_2$, Si$_3$N$_4$, or ZnO$_2$, or other material with low refractive index so as to reflect light from the epitaxial unit 200.

The protrusions 120 may also scatter light so as to emit light from a side wall of the epitaxial unit 200 to increase luminous efficiency of the light-emitting device. Meanwhile, a shape or a size of the protrusions 120 may be designed to improve luminous efficiency. Examples of the shape of the protrusions 120 include column shape, cone shape (i.e., triangular cone, hexagonal cone), pyramid shape, truncated spherical shape, or combinations thereof. The substrate 100 that is made of sapphire is widely applied in the industry. The substrate 100 and the protrusions 120 may be both made of sapphire; otherwise, the substrate 100 may be made of sapphire, and the protrusions 120 may be made of silicon oxide.

The protrusions 120 formed on the first area (Y1) may have a height (h1), and the protrusions 120 formed on the second area Y2 may have a height (h3). The height (h3) is greater than the height (h1). For a part of the protrusions 120 formed on the first area (Y1), the height (h1) of each of the part of the protrusions 120 is no greater than 1 μm. The height (h3) may range from 1 μm to 3 μm. The height (h3) formed on the second area (Y2) of the substrate 100 may be no less than 1.5 μm so as to increase light-extraction efficiency of the light-emitting device. In some embodiments, the height (h3) may range from 1.5 μm to 3 μm (e.g., from 1.8 μm to 2.2 μm).

Referring to FIG. 1A$_1$, in some embodiments, the first semiconductor layer 210, the active layer 220, and the second semiconductor layer 230 may be formed on the substrate 100 by epitaxial growth process (e.g., metal organic chemical vapor deposition (MOCVD), hydride vapor phase epitaxy (HVPE), molecular beam epitaxy (MBE), or combinations thereof.)

In some embodiments, the epitaxial unit 200 may be made of III-V nitride compounds, and may have the thickness ranging from 4 μm to 8 μm.

The first semiconductor layer 210 may be directly disposed on the first surface 110 of the substrate 100. Alternatively, the epitaxial unit 200 may further include a buffer layer 240 (as shown in FIG. 1A$_1$) that is disposed between the substrate 100 and the first semiconductor layer 210. The first semiconductor layer 210 may include an N-type III-V nitride compound, e.g., gallium nitride (GaN), aluminum nitride (AlN), indium nitride (InN), indium gallium nitride (InGaN), aluminum gallium nitride (AlGaN), or aluminum indium gallium nitride (AlInGaN). The first semiconductor layer 210 may further include a dopant, such as silicon (Si) or germanium (Ge). In this embodiment, the first semiconductor layer 210 may have a single layer or a multi-layered structure.

In some embodiments, the active layer 220 may emit blue or deep blue light that has an emission wavelength ranging from 400 nm to 490 nm or green light that has an emission wavelength ranging from 490 nm to 550 nm when the active layer 220 is made of indium gallium nitride (InGaN). When the active layer 220 is made of aluminum gallium nitride (AlGaN), the active layer 220 may emit purple light with the emission wavelength ranging from 250 nm to 400 nm. In some embodiments, the active layer 220 may be an un-doped layer or a layer with low dopant concentration. In some embodiments, the active layer 220 may have a quantum well (QW) structure that may increase luminous efficiency by increasing opportunity of electron-hole re-combinations. The quantum well structure may be made of, but not limited to, indium gallium nitride ($In_xGa_{1-x}N$) or gallium nitride (GaN). In some embodiments, the active layer 220 may has a single hetero-structure (SH), a double hetero-structure (DH), double-side double hetero-structure (DDH), or a multi-quantum well (MQW) structure.

In some embodiments, the second semiconductor layer 230 may be a P-type semiconductor layer. The second semiconductor layer 230 may include a III-V nitride compound, e.g., gallium nitride (GaN), aluminum nitride (AlN), indium nitride (InN), indium gallium nitride (InGaN), aluminum gallium nitride (AlGaN), or aluminum indium gallium nitride (AlInGaN). The second semiconductor layer 230 may include, but not limited to, a dopant, such as magnesium (Mg) or carbon (C). In this embodiment, the second semiconductor layer 230 may have a single layer or a multi-layered structure.

The buffer layer 240 may alleviate lattice mismatch between the substrate 100 and the epitaxial unit 200. The buffer layer 240 may be made of a GaN-based material, e.g., GaN, AlGaN, or AlN. The buffer layer 240 may have a single layer or a multi-layer structure. The buffer layer 240 may be made by MOCVD, MBE, physical vapour deposition (PVD) or combinations thereof. PVD includes sputtering (e.g. reactive sputtering) and evaporation (e.g. electron-beam evaporation, or thermal evaporation). In one embodiment, the buffer layer 240 is an AlN layer, and is made by sputtering. The AlN layer is disposed on the first surface 110 of the substrate 100 that is patterned. Sputtering may be used to form the buffer layer 240 that is uniform and compact. The AlN layer may be conformally deposited on the first surface 110 and on the protrusions 120.

In some embodiments, the current-spreading layer 250 may be made of a transparent conductive material, e.g., indium tin oxide (ITO), indium zinc oxide (IZO), indium oxide (InO), tin oxide (SnO), cadmium tin oxide (CTO), antimony tin oxide (ATO), aluminum zinc oxide (AZO), zinc tin oxide (ZTO), gallium-doped zinc oxide (GZO), tungsten-doped indium oxide (IWO), or zinc oxide (ZnO), etc.

In certain embodiments, the current-spreading layer 250 may be disposed on the second semiconductor layer 230 by deposition, e.g., chemical vapor deposition (CVD), atomic layer deposition (ALD), other suitable method, or combinations thereof. In this embodiment, the current-spreading layer 250 may have a single layer or a multi-layered structure. For example, when the current-spreading layer 250 has multi layers, the current-spreading layer 250 may be a distributed Bragg reflector (DBR) structure.

In the epitaxial unit 200, electrons and holes are driven by a current and re-combine in the active layer 220, so that electrical energy is converted into light energy to emit a light radiation. By changing the physical property and chemical composition of one or more layers of the epitaxial unit 200, the wavelength of light emitted from the light-emitting device can be adjusted.

An embodiment of a method for making the light-emitting device shown in FIG. 1A$_1$ is illustrated. Referring to FIGS. 1B to 1F, the buffer layer 240 is formed on the first surface 110 of the substrate 100 and covers the protrusions 120, the first semiconductor layer 210, the active layer 220, the second semiconductor layer 230 and the current-spreading layer 250 are sequentially formed on the buffer layer 240 opposite to the substrate 100.

Referring to FIG. 1G, for electrically connecting the first electrode 310 with the first semiconductor layer 210, the mesa area (T1) is formed. The mesa area (T1) is formed by removing a part of the epitaxial unit 200 (e.g., a part of the first semiconductor layer 210, a part of the active layer 220, a part of the second semiconductor layer 230 and a part of the current-spreading layer 250) so as to expose the surface of the first semiconductor layer 210. The thickness of the removed epitaxial unit 200 is about 1 μm to 2 μm.

A procedure for forming the mesa area (T1) includes:

forming a patterned shielding layer (not shown) on the current-spreading layer 250 (shown in FIG. 1F) or on the second semiconductor layer 230 (shown in FIG. 1E); and conducting an etching process using the patterned shielding layer as an etch mask so as to remove the part of the epitaxial unit 200.

The etching process may be wet etching, dry etching (e.g., reactive ion etching (RIE), inductively-coupled plasma (ICP), neutral beam etching (NBE), electron cyclotron resonance (ERC), or combinations thereof), other suitable methods, or any combination thereof. The wet etching may use hydrofluoric acid (HF), ammonium hydroxide ($NH_4OH$), or any other suitable reagent as an etchant.

It is noted that, in certain embodiments, during formation of the mesa area (T1), the first semiconductor layer 210 may not be completely removed.

A distance between the mesa area (T1) and the recess 130 of the first surface 110 of the substrate 100 may range from 3 μm to 5 μm, so that the thickness of the epitaxial unit 200 is greater than the height (h3) of the protrusions 120 on the second area (Y2). Therefore, the protrusions 120 on the second area (Y2) may not be exposed from, the mesa area (T1).

After forming the mesa area (T1), the patterned shielding layer is removed. In some embodiments, after the etching step, the epitaxial unit 200 may form a rounded corner. As shown in FIG. 1H, the rounded corner is formed at the current-spreading layer 250 when the epitaxial unit 200 has the current-spreading layer 250. To be specific, the rounded corner is formed at an intersection of a top surface and a side wall of the current-spreading layer 250. In the embodiment where the current-spreading layer 250 is not formed, the rounded corner is formed at the second semiconductor layer 230. With the rounded corner, a film that is formed in subsequent deposition procedure is less likely to be broken or too thin at the corner of the epitaxial unit 200, which improves stability of the photoelectric property of the light-emitting device.

Since the substrate 100 may be cut after the light-emitting device is formed, the substrate 100 is defined to have at least one dicing groove (B). The dicing groove (B) corresponds in position to the first area (Y1) of the substrate 100 in FIG. 1A$_1$. After the mesa area (T1) is formed, a portion of the epitaxial unit 200 that is located at a position where the dicing groove (B) and the first area (Y1) are to be formed is removed, so that the first area (Y1) of the first surface 110 of the substrate 100 is formed and exposed, and the protrusions 120 on the first area (Y1) are exposed (see, e.g., FIG. 1H).

Removal of the portion of the epitaxial unit 200 located corresponding in position to the dicing groove (B) is conducting by etching a portion of the first semiconductor layer 210 and a portion of the buffer layer 240 located on the dicing groove (B) starting from the mesa area (T1) so as to expose tops of the protrusions 120 on the dicing groove (B). Then, the epitaxial unit 200 located among the exposed protrusions 120 on the dicing groove (B) is removed, so as to form and expose the first area (Y1) of the first surface 110 of the substrate 100.

Removal of the portion of the epitaxial unit 200 located corresponding in position to the dicing groove (B) may be conducting by inductively coupled plasma (ICP) using chloride etching gas, e.g., gas containing chlorine and boron chloride.

In conventional processes, in order to ensure that a nitride-based epitaxial layer can be removed as soon as possible so as to improve production rate and reduce time cost, an etching gas that has superior etching rate to the nitride-based epitaxial layer is used. For example, in a case that a substrate and protrusions formed on the substrate are both made of sapphire, Cl$_2$ gas is usually used as an etching gas for the nitride-based epitaxial layer, and thus, the protrusions formed on the substrate is almost un-changed. The inventor found that the height difference between an etched area (e.g., the first area (Y1)) and an un-etched area covered by the nitride-based epitaxial layer (e.g., the second area (Y2)) and change in a height of exposed protrusions on the etched area are not considered. However, such factors may affects structural integrity of the insulation layer 400 (e.g., cracks may occur in the insulation layer 400 if the factors are not well controlled).

Furthermore, if a distance between two adjacent ones of the protrusions 120 (i.e. a width of each of the recesses 130) is relatively small, e.g., less than 0.5 μm, the epitaxial unit 200 (e.g., the buffer layer 240) may remain between the protrusions 120 on the first area (Y1), which may cause short circuit, especially when the buffer layer 240 (e.g., an N-type GaN layer) has a doping type the same as that of the first semiconductor layer 210.

In addition, the width of the first area (Y1) is relatively small (usually not greater than 25 μm), moisture may easily enter the epitaxial unit 200, which results in device failure.

To improve the reliability of the substrate 100 and ensure coverage continuity of the insulating layer 400 and further to ensure complete removal of the epitaxial unit in the first area (Y1), in this disclosure, the process for etching the epitaxial unit 200 is modified.

Firstly, an etching procedure starts from the mesa area (T1) so as to remove a part of the first semiconductor layer 210 and a part of the buffer layer 240 under a relatively high etch rate. In this step, an etching gas containing a relatively large amount of chlorine (e.g., a ratio of chlorine to boron chloride is about 7:1) is used. When the tops of the protrusions 120 are exposed (see, e.g., FIG. 1I), the etching condition is changed so that the etch rate to the epitaxial unit 200 is decreased, while the etch rate to the protrusion 120 is increased. Thus, while the buffer layer 240 located corresponding in position to the dicing groove (B) is removed, the protrusions 120 located corresponding in position to the dicing groove (B) is also etched and thus have reduced height, which may ensure coverage continuity of the insulating layer 400 so as to improve the reliability of the light-emitting device. The etch rate may be adjusted by selection of the components of the etching gas or changing the flow rate of the etching gas. For example, a decrease in the flow rate of chlorine may reduce the etch rate to the nitride-based epitaxial unit 200. An increased in the flow rate of boron chloride may reduce the etch rate to the nitride-based epitaxial unit 200 but increase the etch rate to the sapphire protrusions 120.

Referring to FIG. 1K, in this disclosure, after the etching procedure, the height (h1) of the protrusions 120 on the first area (Y1) (i.e., dicing groove (B)) can be lowered, and the coverage continuity of the insulating layer 400 that is made of a material with less compactness can be improved.

The height (h1) of the protrusions 120 on the first area (Y1) may be reduced to no greater than 1 μm, and the first area (Y1) of the substrate 100 may be lower than the second area (Y2). The aforesaid modified process ensures that the epitaxial unit 200 on the first area (Y1) and the epitaxial unit 200 (e.g., the buffer layer 240) remained between the protrusions 120 on the first area (Y1) can be completely removed.

In this disclosure, the height difference (h2) between the first area (Y1) and the second area (Y2) (i.e., the height difference between the recesses 130 in the first area (Y1) and the recesses 130 in the second area (Y2)) is designed to be no less than 0.2 μm in order to completely remove the epitaxial unit 200 (e.g., the GaN buffer layer 240) among the protrusions 120 on the first area (Y1). In addition, the height difference (h2) may be no greater than 1 μm; otherwise, the coverage continuity of the insulating layer 400 may be unfavorably influenced and the processing time may be extended.

The aforesaid etching procedure for etching the epitaxial unit 200 and the protrusions 200 to form the first area (Y1) is exemplified using the following embodiment, in which the first semiconductor layer 210 is an N-type GaN layer, the buffer layer may include an N-type GaN layer, and the substrate 100 and the protrusions 200 are made of sapphire.

First, the epitaxial unit 200 shown in FIG. 1F is etched to have the structure shown in FIG. 1I, where the tops of the protrusions 120 on the dicing groove (B, i.e., the first area (Y1)) are exposed. In this procedure. The etch rate for the epitaxial unit 200 is relatively high.

Secondly, the buffer layer 240 and the protrusions 200 on the dicing groove (B) are further etched under different etch rate. Specifically, an etching gas containing $Cl_2$ and $BCl_3$ is used so that the etch rate to the buffer layer 240 is reduced while the etch rate to the protrusions 200 is increased. Referring to FIG. 1J, the buffer layer 240 among the protrusions 200 in the dicing groove (B) is completely removed, and the height (h1) of the protrusions 200 on the dicing groove (B) is reduced since the protrusions 200 are etched.

Then, referring to FIG. 1K, the substrate 100 and the protrusions 200 on the dicing groove (B) are further etched so that the first area (Y1) that is lower than the second area (Y2) is thus formed, thereby ensuring that the buffer layer 240 among the protrusions 200 in the first area (Y1) is completely removed.

In certain embodiments, the first area (Y1) may surrounds the epitaxial unit 200.

In the aforesaid embodiment, the first area (Y1) is formed by etching from the mesa area (T1), and the remaining of the mesa area (T1) is used to support the first electrode 310. In some embodiments, referring to FIGS. 1F and 1L to 1N, no mesa area (T1) is formed. In other embodiments, referring to FIGS. 1F and 1O to 1Q, a plurality of epitaxial units 200 are formed, and a plurality of first areas (Y1, i.e., a plurality of dicing groove (B)) are formed to separate the epitaxial units 200.

Referring to FIG. 1J, the epitaxial unit 200 has a side surface which forms an included angle (θ) with the first surface 110. The included angle (θ) may be greater than 0 degree and smaller than 90 degree. For example, the included angle (θ) may range from 20 to 60 degree. With the included angle (θ), the insulating layer 400 may be easily and more uniformly formed on the epitaxial unit 200 and the substrate 100.

When current is provided, the current flows from the second electrode 320 through the epitaxial unit 200 to the first electrode 310, and is laterally distributed in the epitaxial unit 200, and photons are generated through photoelectric effect. The active layer 220 may emit light with different wavelengths based on its material, in which N-type semiconductor layer generate electrons and P-type semiconductor layer generates holes. The electrons and the holes recombine in the active layer 220 so as to release energy in the form of photons, thereby emitting light.

Referring to FIGS. 1R and 1S, the insulating layer 400 covers the epitaxial layer 200, the first area (Y1), the side wall and a part of the upper surface of the first contact electrode portion 311, and the side wall and a part of the upper surface of the second contact electrode portion 321. To be specific, the insulating layer 400 is disposed by sputtering or deposition processes. The insulating layer 400 retains different functionalities with respect to its position. For example, the insulating layer 400 that covers the side wall of the epitaxial unit 200 may prevent short circuit caused by undesired electrical connection between the first semiconductor layer 210 and the second semiconductor layer 230. In some embodiments, the insulating layer 400 may be made of a non-conductive material, such as inorganic oxide, inorganic nitride, etc. Examples of the material for the insulating layer 400 include, e.g. aluminum oxide ($Al_2O_3$), silicon nitride (SiNx), silicon oxide (SiOx), titanium oxide (TiOx), magnesium fluoride (MgFx), tantalum oxide, niobium oxide, barium titanium, or combinations thereof.

In certain embodiments, the insulating layer 400, at least the portion that covers the first area (Y1), includes first sublayers (not shown) and second sublayers (not shown) that are alternately arranged to form a laminated structure. The first sublayers and the second sublayers are made from different materials. In some embodiments, the insulating layer 400 may be formed into a DBR structure.

To be specific, according to the size of the light-emitting device, the insulating layer 400 may have the thickness no less than 50 nm, or no less than 1000 nm. For example, the insulating layer 400 may be a single layer that has a thickness no less than 50 nm (e.g. from 50 nm to 500 nm). In other embodiments, the insulating layer 400 may include the DBR structure which has the thickness no less than 1000 nm.

The insulation layer 400 may include the DBR structure and may have a thickness ranging from 1 μm to 6 μm, e.g., 1-3 μm or 3-5 μm. For the flip-chip LED with a small size, the thickness of the insulation layer 400 may range from 1-3 μm so as to reduce stress caused by the insulation layer 400.

Referring to FIG. 1T, in some embodiments, the light-emitting device includes a plurality of the epitaxial units 200 that are spaced apart from one another by the dicing grooves (B). The dicing grooves (B) correspond in position to the first area (Y1) of the first surface 110. In this disclosure, the epitaxial units 200 may be referred to as light-emitting areas (A).

FIG. 2 shows an embodiment of the light emitting device of the disclosure which includes two of the epitaxial units 200 (e.g., a first unit (C) and a second unit (D)) disposed on the substrate 100, the first electrode 310, and the second electrode 320.

In this embodiment, the first unit (C) electrically connects with the second unit (D). The first unit (C) and the second unit (D) are spaced apart from each other by the first area (Y1) (also referred to as a separating groove (B')). The substrate 100 is a patterned substrate that has the first surface 110 on which the epitaxial units 200 are formed. The first surface 110 is formed with a plurality of the protrusions 120 and a plurality of the recesses 130 that are formed among the protrusions 120. By removing a portion of the epitaxial unit 200 using the aforesaid etching process, the first area (Y1) that is not covered by the epitaxial unit 200 may be lower than the second areas (Y2) so as to improve reliability of the light-emitting device.

In addition, the height (h1) of the protrusions 120 formed on the first area (Y1) being lower than the height (h3) of the protrusions 120 formed on the second area (Y2) may lower the density and height of the protrusions 120 on the first area (Y1) so as to prevent the insulating layer 400 (e.g., the DBR structure) and an electrode formed on the first area (Y1) from being cracked. Each of the first unit (C) and the second unit (D) includes the buffer layer 240, the first semiconductor layer 210, the active layer 220, and the second semiconductor layer 230. The first electrode 310 includes the first contact electrode portion 311 and the first pad electrode portion 312. The second electrode 320 includes the second contact electrode portion 321 and the second pad electrode portion 322. The first contact electrode portion 311 is electrically connected to the first semiconductor layer 210 of the second unit (D), and the second contact electrode portion 321 is electrically connected to the second semiconductor layer 230 of the first unit (C).

In certain embodiments, each of the first unit (C) and the second unit (D) further includes the current-spreading layers 250 disposed on the second semiconductor layer 230. In addition, a blocking layer 260 may be interposed between the second semiconductor layer 230 and the current-spreading layer 250 of the first unit (C) so as to prevent the current from accumulating at the second electrode 320, thereby improving reliability of the light-emitting device. The blocking layer 260 is also disposed on the first area (Y1) of the substrate 100 and a part of a side wall of the first unit (C) and a part of a side wall of the second unit (D). The blocking layer 260 may further extend to the current-spreading layer 250 of the second unit (D).

In certain embodiments, the blocking layer 260 may be a transparent insulating layer so as to not affect the luminous efficiency of the light-emitting device. An interconnect electrode 350 is disposed on the blocking layer 260. One end of the interconnect electrode 350 electrically connects with the second semiconductor layer 230 of the second unit (D), and an opposite end of the interconnect electrode 350 connects with the first semiconductor layer 210 of the first unit (C), thereby electrically connecting the first unit (C) and the second unit (D) in series.

A reflecting layer 500 is disposed on and covers the first unit (C), the second unit (D), and the interconnect electrode 350 on the first area (Y1).

In some embodiments, the reflecting layer 500 may be an insulating reflecting layer 500. For example, the reflecting layer 500 may be a DBR structure that is constituted by a plurality of insulating layers. In this case, the first pad electrode portion 312 and the second pad electrode portion 322 may respectively connect with the first unit (C) and the second unit (D) through corresponding openings in the reflecting layer 500.

In some embodiments, referring to FIGS. 1K, 1N, and 2, the height difference (h2) between the first area (Y1) and the second area (Y2) (i.e., the height difference between the recesses 130 in the first area (Y1) and the recesses 130 in the second area (Y2)) is no greater than 1 μm. The height difference (h2) may range from 0.10 μm to 0.80 μm, e.g., 0.10 μm, 0.20 μm, 0.30 μm, 0.40 μm, 0.50 μm, 0.51 μm, 0.52 μm . . . , 0.80 μm, etc. Accordingly, the first area (Y1) may substantially separate the first unit (C) and the second unit (D) from each other so as to improve reliability of the light-emitting device.

As mentioned above, for improving reliability of the light-emitting device, in some embodiments, the protrusions 120 formed in the first area (Y1) is etched to have a lower height (h1) through etching (e.g., ICP, wet etching, dry etching, combinations thereof). Since the protrusion 120 formed on the first area (Y1) has reduced height (h1), the layers (e.g., the insulating layer 400) disposed on the protrusions 120 on the first area (Y1) may have mild fluctuation which improves reliability of the light-emitting device.

The height (h1) of each of the protrusions 120 formed on the first area (Y1) may be no greater than 1 μm. The height (h1) may be 0.01 μm, 0.02 μm, 0.03 μm, 0.04 μm, 0.50 μm, 0.51 μm, 0.52 μm . . . , 0.95 μm, 0.96 μm, 0.97 μm, 0.98 μm, 0.99 μm, etc.

The height (h3) of each of the protrusions 120 formed on the second area (Y2) may range from 1 μm to 3 μm, e.g., 1.01 μm, 1.02 μm, 1.03 μm, 10.4 μm . . . , 1.51 μm, 1.52 μm, 1.53 μm, 1.54 μm . . . , 2.50 μm, 2.51 μm, 2.52 μm . . . , 2.95 μm, 2.96 μm, 2.97 μm, 2.98 μm, 2.99 μm, etc.

Referring to FIGS. 1K and 1N, in some embodiments, for a part of the protrusions 120 formed on the first area (Y1), a ratio of the height (h1) of each of the part of the protrusions 120 to the height (h3) of each of the protrusions 120 formed on the second area (Y2) may be no greater than 0.50 or no less than 0.20. In certain embodiments, the ratio of the height (h1) of each of the part of the protrusions 120 to the height (h3) of each of the protrusions 120 formed on the second area (Y2) may range from 0.20 to 0.50, e.g., 0.20, 0.21, 0.22, 0.23 . . . 0.35, 0.36, 0.37 . . . 0.50.

There is a distance (d1) between geometric centers of two adjacent ones of the protrusions 120 on the first area (Y1), and there is a distance (d2) between geometric centers of two adjacent ones of the protrusions 120 on the second area (Y2). In some embodiments, by controlling the height (h1), the height (h3), the distances (d1), the distance (d2), and an amount of the protrusions 120, the objects of the disclosure may be achieved. In certain embodiments, the distance (d1) may be no less than 1 μm, i.e., 1.0 μm, 1.1 μm, 1.2 μm, 1.3 μm . . . , 2 μm, 2.1 μm . . . , 2.5 μm, 2.6 μm . . . , 3 μm, 3.1 μm . . . , 4 μm, 4.1 μm . . . , 5 μm. In certain embodiments, the distance (d2) may be no greater than the distance (d1), e.g., 0.5 μm, 0.6 μm, 0.7 μm . . . , 1.0 μm, etc.

In other embodiments, the first area (Y1) on the substrate 100 may not be covered by the epitaxial unit 200 in the beginning. By aforesaid process, the height (h1) of the protrusions 120 formed on the first area (Y1) may be reduced through etching, so that the insulating layer 400 may have mild fluctuation so as to avoid formation of holes or cracks. Thus, reliability of the light-emitting device may be improved. Finally, the light-emitting device may be packaged using polymer so as to form a packaging structure.

The following embodiments are provided for improving reliability of the light-emitting device, and have structures (e.g., the epitaxial unit 200, the first electrode 310, the second electrode 320 insulating layer 400, etc.) similar to those of the previous embodiments except for the configuration of the protrusions 120. The similar structures are omitted herein for brevity.

Referring to FIG. 3, in this embodiment, no protrusions 120 are formed on the first area (Y1) of the substrate 100. In a process for forming this embodiment, the protrusions 120 may only be formed on the second area (Y2) not on the first area (Y1), by e.g., etching using a mask. Alternatively, the method includes forming the epitaxial unit 200 on the substrate 100, removing a part of the epitaxial unit 200 on the dicing groove (B) until the substrate 100 is exposed, and removing the protrusions 120 on the exposed substrate 100 by etching using a mask, followed by forming the insulating layer 400 which has mild fluctuation on the epitaxial unit 200 and the exposed substrate 100. In this method, the etching procedure should be precisely controlled to simultaneously remove the protrusions 120 on the first area (Y1) while maintain the structural entirety.

In an embodiment, referring to FIGS. 4 and 5, each of the protrusions 120 includes a first portion 120' and a second portion 120". The first portion 120' is disposed close to the substrate 100. The second portion 120" is disposed on the first portion 120' opposite to the first surface 110. The second portion 120" may be a sacrificing portion that may be easily removed by the aforesaid etching process as compared to the first portion 120'. The second portion 120" of the protrusions 120 on the first area (Y1) may be removed when the protrusion 120 is etched.

The protrusions 120 or the first portion 120' of the protrusions 120 may have a shape, e.g., hemisphere, column shape, cone shape, pyramid shape, truncated spherical shape, or combinations thereof, and may have the reduced height (h1) that facilitates formation of the insulating layer 400 thereon.

Referring to FIG. 5, the second portion 120" covers the first portion 120'. In the etching process, for the protrusions 120 formed on the first area (Y1), the second portion 120" is removed while the first portion 120' is remained and exposed. In certain embodiments, the first portions 120' may be made of a material the same as the substrate 100 (e.g., sapphire), and the second portions 120" may be made of a material, e.g., silicon oxide that is easier to be removed, or aluminum nitride. While silicon oxide may be removed more easily as compared to aluminum nitride, aluminum nitride with less lattice mismatch problem may be more suitable for growing gallium nitride thereon.

Comparing with sapphire or aluminum nitride, silicon oxide has greater lattice mismatch problem with gallium nitride but may be easily removed. Referring to FIG. 6, for considering process difficulty and crystal quality, the protrusions 120 may further include a third portion 120'''. The third portion 120''' may be a crystal growth portion that is more suitable for growing crystals thereon as compared to the second portion 120". The second portion 120" may be removed more easily than the first portion 120' and the third portion 120'''. When the second portion 120" of each of the protrusions 120 on the first area (Y1) is removed by the foresaid process, the third portion 120''' that is on the second portion 120''' may also be removed at the same time, and the first portion 120' may remain intact and is further covered by the insulating layer 400. In some embodiments, the first portion 120' is made of sapphire, the second portion 120" is made of silicon dioxide, and the third portion 120''' is made of aluminum nitride.

The light-emitting device of the disclosure may be applied in a lighting apparatus or a display apparatus. The lighting apparatus may include, but not limited to, a chip-on-board lighting apparatus, an ultraviolet lighting apparatus, a bulb lamp, or a flexible filament lamp.

The light-emitting device may be the flip-chip light-emitting diode. The first pad electrode portion 312 and the second pad electrode portion 322 of the light-emitting device may be connected with other circuit board using a solder by reflow soldering technology to form the display apparatus.

The display apparatus may be a backlight apparatus or a RGB direct display apparatus, e.g., television, mobile phone, screen, computer, or outdoor display. Referring to FIG. 7, the display apparatus includes a board 600 and the aforesaid light-emitting device (e.g., the flip-chip light-emitting device 700) mounted on the board 600. The board 600 may be a chip-on-board (COB), a chip-on-glass (COG), or a surface-mount-device (SMD) board 600.

Referring to FIG. 7, the display apparatus further includes an encapsulant layer 800.

In certain embodiments, the board 600 may be a flat board, or may be formed with a reflecting cup which defines a space for amounting the flip-chip light-emitting device 700.

Referring to FIG. 7, the board 600 includes a bottom plate 610 and a sidewall 620. The sidewall 620 is formed into a reflecting cup. The bottom plate 610 has a mounting area 611, a first welding area 612, and a second welding area 613 on a top surface thereof. The first welding area 612 and the second welding area 613 are electrically isolated from each other. The flip-chip light-emitting device 700 is mounted on the mounting area 611, and connects with the first welding area 612 and the second welding area 613 through the first pad electrode portion 312 and the second pad electrode portion 322, respectively. The encapsulant layer 800 seals the flip-chip light-emitting device 700 on the board 600.

For example, each of the first pad electrode portion 312 and the second pad electrode portion 322 of the flip-chip light-emitting device 700 may be provided with a solderable metal layer (e.g., conductive solder paste). Each of the first welding area 612 and the second welding area 613 may be provided with a metal electrode so that the flip-chip light-emitting device 700 may be respectively connected with the first welding area 612 and the second welding area 613 by eutectic soldering or the paste soldering.

In certain embodiments, a hundreds of or a thousands of the mini light-emitting devices of this embodiments may be mounted on the board 600 (e.g., an applied circuit board or a packaging board) so as to form a light source of the backlight display or the RGB direct display.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A light-emitting device, comprising:
   a substrate having a first surface and a second surface opposite to said first surface, said substrate being formed on said first surface with a plurality of protrusions and a plurality of recesses, said protrusions being spaced apart from one another by said recesses; and
   an epitaxial unit including a first semiconductor layer, an active layer, and a second semiconductor layer that are sequentially disposed on said first surface of said substrate in such order;
   wherein said first surface of said substrate has a first area not covered by said epitaxial unit, and a second area covered by said epitaxial unit, said first area being lower than said second area, a height difference (h2) between said first area and said second area being no greater than 1 μm.

2. The light-emitting device according to claim 1, wherein each of said protrusions formed on said second area has a height (h3), each of said protrusions formed on said first area having a height (h1), h3 being greater than h1.

3. The light-emitting device according to claim 2, wherein the height (h1) of one or more of said protrusions on said first area is no greater than 1 μm.

4. The light-emitting device according to claim 2, wherein the height (h3) of each of said protrusions formed on said second area ranges from 1 μm to 3 μm.

5. The light-emitting device according to claim 2, wherein the height (h3) of each of said protrusions formed on said second area is no less than 1.5 μm.

6. The light-emitting device according to claim 2, wherein, a ratio of the height (h1) of one or more of said protrusions to the height (h3) of each of said protrusions formed on said second area is no less than 0.20.

7. The light-emitting device according to claim 2, wherein, a ratio of the height (h1) of one or more of said protrusions to the height (h3) of each of said protrusions formed on said second area is no greater than 0.50.

8. The light-emitting device according to claim 1, wherein the height difference (h2) between said first area and said second area is no less than 0.2 μm.

9. The light-emitting device according to claim 1, wherein a distance between geometric centers of two adjacent ones of said protrusions formed on said first area is no less than 1 μm.

10. The light-emitting device according to claim 1, wherein a distance between geometric centers of two adjacent ones of said protrusions formed on said second area is no greater than a distance between geometric centers of two adjacent ones of said protrusions formed on said first area.

11. The light-emitting device according to claim 1, wherein said first area has a width that is no greater than 25 μm.

12. The light-emitting device according to claim 1, further comprising an insulating layer that covers said first area, wherein said insulating layer that covers said first area has a thickness no less than 50 nm.

13. The light-emitting device according to claim 12, wherein said insulating layer that covers said first area has a thickness no less than 1000 nm, and said insulating layer that covers said first area includes first sublayers and second sublayers that are alternately arranged to form a laminated structure, said first sublayers and said second sublayers being made from different materials.

14. The light-emitting device according to claim 1, comprising two of said epitaxial units that are spaced apart from each other by said first area.

15. The light-emitting device according to claim 1, wherein said first area surrounds said epitaxial unit.

16. The light-emitting device according to claim 1, wherein said light-emitting device is a flip-chip light-emitting device.

17. The light-emitting device according to claim 1, wherein said substrate and said protrusions are made of the same material.

18. The light-emitting device according to claim 1, wherein each of said protrusions is in a cone shape.

19. The light-emitting device according to claim 1, wherein a height difference between said recesses on said first area and said recesses on said second area is no greater than 1 μm.

20. A lighting apparatus, comprising a light-emitting device as claimed in claim 1.

* * * * *